United States Patent
Hwang

(10) Patent No.: US 7,424,143 B2
(45) Date of Patent: Sep. 9, 2008

(54) METHOD FOR RECOGNIZING WORKING POSITION OF A DEVICE TRANSFER APPARATUS IN SEMICONDUCTOR TEST HANDLER

(75) Inventor: Hyun Joo Hwang, Kyonggi-do (KR)

(73) Assignee: Mirae Corporation, Chunan-si (KR)

( * ) Notice: Subject to any disclaimer, the term of this patent is extended or adjusted under 35 U.S.C. 154(b) by 661 days.

(21) Appl. No.: 10/314,951

(22) Filed: Dec. 10, 2002

(65) Prior Publication Data

US 2003/0113010 A1 Jun. 19, 2003

(30) Foreign Application Priority Data

Dec. 17, 2001 (KR) ...................... 10-2001-0080154

(51) Int. Cl.
*G06K 9/00* (2006.01)
*H01L 21/66* (2006.01)
*G01R 31/26* (2006.01)

(52) U.S. Cl. ........................................ 382/141; 438/14

(58) Field of Classification Search ......... 382/141–152; 438/14–18

See application file for complete search history.

(56) References Cited

U.S. PATENT DOCUMENTS

| | | | | |
|---|---|---|---|---|
| 5,247,844 A | * | 9/1993 | Howell | ......................... 438/15 |
| 5,798,652 A | * | 8/1998 | Taraci | ......................... 438/15 |
| 5,812,409 A | * | 9/1998 | Kanno et al. | ................. 700/213 |
| 5,865,319 A | * | 2/1999 | Okuda et al. | ................. 209/574 |
| 5,946,409 A | * | 8/1999 | Hori | ............................ 382/149 |
| 6,020,745 A | * | 2/2000 | Taraci | ........................ 438/15 |
| 6,202,031 B1 | * | 3/2001 | Campbell et al. | .............. 702/95 |
| 6,259,247 B1 | * | 7/2001 | Bannai | ..................... 324/158.1 |
| 6,588,096 B1 | * | 7/2003 | Hidese | ......................... 29/832 |
| 6,847,202 B2 | * | 1/2005 | Hwang et al. | ............ 324/158.1 |

FOREIGN PATENT DOCUMENTS

TW 449853 8/2001

* cited by examiner

*Primary Examiner*—Bhavesh Mehta
*Assistant Examiner*—Manav Seth
(74) *Attorney, Agent, or Firm*—KED & Associates, LLP

(57) ABSTRACT

A method for recognizing working position in a semiconductor test handler is disclosed. The method includes the steps of: (a) obtaining necessary information through image input unit while moving device transfer unit to upper portion of tray and in horizontal and vertical directions; (b) obtaining image information of identifiers attached to respective change kits through the image input unit while moving the device transfer unit to the respective change kits and moving the device transfer unit in one direction, and simultaneously obtaining origin of the change kit; (c) comparing kinds of semiconductor devices inputted into control unit of the handler with information of the identifiers which are obtained in the step of (b), and determining whether or not the kinds of the semiconductor devices accords with those of the change kits; and (d) calculating the working position of the device transfer unit using the image information obtained through the steps a) to c) in the image processor and the control unit.

20 Claims, 5 Drawing Sheets

METHOD FOR RECOGNIZING WORKING POSITION OF A DEVICE TRANSFER APPARATUS IN SEMICONDUCTOR TEST HANDLER

This application claims the benefit of the Korean Application No. P2001-80154 filed on Dec. 17, 2001, which is hereby incorporated by reference.

BACKGROUND OF THE INVENTION

1. Field of the Invention

The present invention relates to a method for recognizing working position of a device transfer apparatus in a semiconductor test handler, and more particularly, to a method for recognizing working position of a device transfer apparatus, which is capable of rapidly and correctly recognizing and resetting the working position for trays and change kits used as replacement parts when other kinds of semiconductor devices are tested.

2. Discussion of the Related Art

Generally, semiconductor devices whose manufacturing processes have been completed in production lines are tested so as to determine whether semiconductor devices are good or defective before shipment.

A handler is an apparatus for testing these semiconductor devices. While the semiconductor devices loaded into trays are automatically transferred between processes using an apparatus for transferring semiconductor devices, the semiconductor devices are installed in a test socket of a test site and then a desired test is performed. Then, the semiconductor devices are classified into several grades according to the test results, and processes of again unloading them into the trays are repeatedly performed.

FIG. 1 is an exemplary view showing the construction of a handler. Referring to FIG. 1, a loading part 2 and an unloading part 3 are installed in a front side of a handler body 1. The loading part 2 loads trays which to-be-tested semiconductor devices are received therein. The unloading part 3 is provided with a plurality of trays which classify test-completed semiconductor devices into good productions or to-be-retested productions according to the test results and reload semiconductor devices into the trays. In addition, a soaking plate 7 with a heater (not shown) and a cooler (not shown) is provided in a rear side of the loading portion 2 to heat or cool the to-be-tested semiconductor devices to a predetermined temperature during a temperature test.

A reject multi-stacker 5 into which a plurality of trays are loaded is provided in a rear side of the unloading part 3 so as to receive the semiconductor devices classified defective into the trays thereof according to the grades.

Test sockets 11 are installed in a test site 10 disposed at a rearmost position of the handler body 1. The test sockets 11 are electrically connected with an external test apparatus and test performances of the semiconductor devices. First and second index heads 12a and 12b movable in left and right directions are equipped over the test sockets 11. The first and second index heads 12a and 12b pick up the semiconductor device transferred to standby positions of both sides of the test sockets 11 to load them into the test socket 11, and at the same time, they picks up the test-completed semiconductor devices to move them to the standby positions.

First and second shuttles 8a and 8b movable in forward and backward directions are installed right before the test site 10. The first and second shuttles 8a and 8b receive the semiconductor devices from the loading portion 2 or the soaking plate 7 and supply them to the standby positions disposed at both of the test sockets 11 of the test site 10. In addition, third and fourth shuttles 9a and 9b movable in forward and backward directions are installed in each one side of the first and second shuttles 8a and 8b. The third and fourth shuttles 9a and 9b receive the test-completed semiconductor devices from the test site 10 and supply them to an outer side of the test site 10.

Fixed frames 13 traversing the handler body 1 are installed in the front side of the handler body 1 and an upper portion of just front side of the test site 10, respectively. A pair of moving frames 14a and 14b are mounted on the fixed frames 13 so that the pair of the moving frames 14a and 14b are movable in left and right directions along the fixed frames 13. Device transfer units 15 are installed to be movable in forward and backward directions along the moving frames 14a and 14b and pick up and transfer the semiconductor devices. The device transfer units 15 include a plurality of pickers (not shown) capable of picking up a plurality of semiconductor devices at one time.

Meanwhile, the handlers can generally test various kinds of the semiconductor devices, such as QFP, BGA, SOP, etc., in one apparatus. If one kind of semiconductor device is tested and then other kinds of semiconductor device needs to be tested, the trays and the change kits, such as the socking plate 7, the shuttles 8a, 8b, 9a and 9b and the test sockets 11, are suitably replaced according to the kinds of the to-be-tested semiconductor devices, so that the test operation is performed.

At this time, since the change kits replaced according to the kinds of the to-be-tested semiconductor devices are different from previous changes kits in size of the loading portion into which the semiconductor devices are loaded and its pitch, working periods of the device transfer units 15 must be again reset through a control unit (not shown) of the semiconductor test handler. In other words, as specifications of the change kits are changed, the positions in which the device transfer units 15 pick up the semiconductor devices are changed and thus all of the movement distance of the device transfer units 15, the pitches between the pickers (not shown) of the device transfer units 15 and elevation heights of the pickers must be again reset.

Meanwhile, a use checks the specifications of the change kits replaced as above one by one using a measurement jig, and inputs them into the control unit (not shown) of the semiconductor test handler, so that a programming is carried out and the working position is set. In that case, a probability of occurrence of error is increased during the inputting of them, and a time required to set the working position is taken long. In addition, there are problems that production per day is reduced and efficiency for the test operation is totally degraded. These problems may be also increased with an increase of the kinds and the number of change kits.

To solve the above problems, Korean Pat. No. 10-0261957, issued in Apr. 25. 2000, entitled "HORIZONTAL TRANSFER TEST HANDLER", discloses that a CCD camera as an image input unit is installed in a device transfer unit that is an apparatus for transferring devices (semiconductor devices), and information of trays and change kits are taught using an image obtained by the CCD camera.

However, the above horizontal transfer test handler must set a reference position on a handler body so as to correct a position of the device transfer unit, and the process of recognizing and setting the working position of the device transfer unit is relatively complicated, so that the time required to set the working position is taken long.

SUMMARY OF THE INVENTION

Accordingly, the present invention is directed to a method for recognizing a working position in a semiconductor test handler that substantially obviates one or more problems due to limitations and disadvantages of the related art.

An object of the present invention is to provide a method for recognizing a working position of a device transfer apparatus in a semiconductor test handler, capable of minimizing information which must be previously inputted in a control unit of the handler. In addition, in a simple manner, the method of the present invention can correctly and rapidly teach and reset automatically information on the specifications of change kits replaced according to the changes of the kinds of to-be-tested semiconductor devices and corresponding working positions.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for recognizing a working position of a device transfer apparatus in a semiconductor test handler, the semiconductor test handler including: a plurality of trays for loading a to-be-tested semiconductor device and a test-completed semiconductor device; change kits including a plurality of shuttles on which the semiconductor devices are loaded during the test operation and a test socket in which the test operation is performed, the change kit provided at one side thereof with identifiers in which various data of respective change kits are inputted; the device transfer unit movably installed in a horizontal direction over a handler body, for picking up and transferring the semiconductor devices according to, commands of a control unit of the semiconductor test handler; an image input unit fixedly installed on the device transfer unit; and an image processor for analyzing and processing an image obtained by the image input unit, the method comprising the steps of: a) obtaining necessary information through the image input unit while moving the device transfer unit to an upper portion of the tray and in horizontal and vertical directions; b) obtaining image information of the identifiers attached to the respective change kits through the image input unit while moving the device transfer unit to the respective change kits and moving the device transfer unit in one direction, and simultaneously obtaining an origin of the change kit; c) comparing kinds of the semiconductor devices which are inputted into the control unit of the semiconductor test handler with the information of the identifiers which are obtained in the step b), and determining whether or not the kinds of the semiconductor devices accord with those of the change kits; and d) calculating the working position of the device transfer unit using the image information obtained through the steps a) to c) in the image processor and the control unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
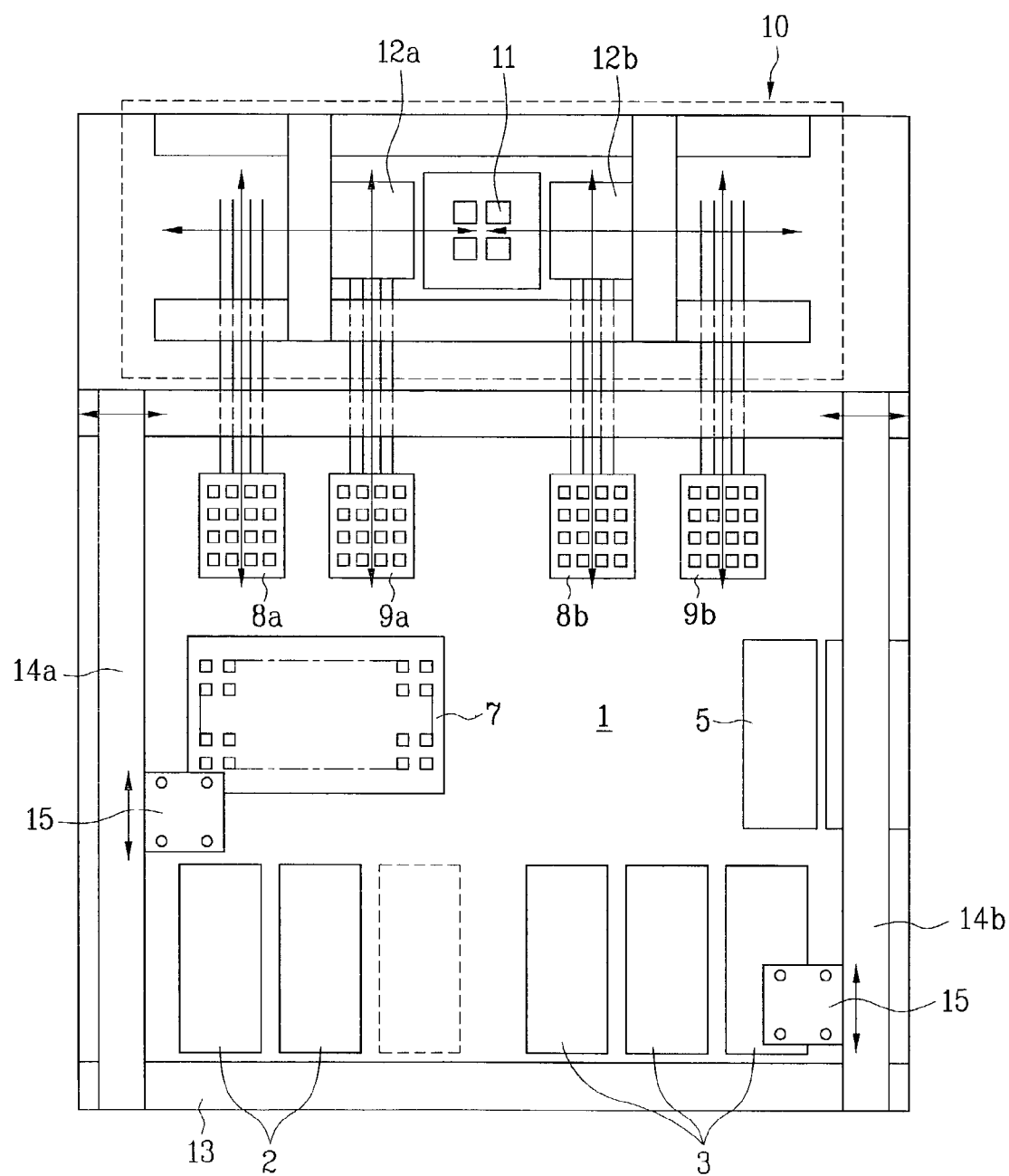
FIG. 1 is a plan view of an exemplary construction of a conventional semiconductor test handler.

For understanding a construction of a handler applicable to a method for recognizing a working position in a device transfer apparatus in accordance with the present invention, the construction of the conventional handler shown in FIG. 1 will be hereby incorporated by reference.

Figure 2:
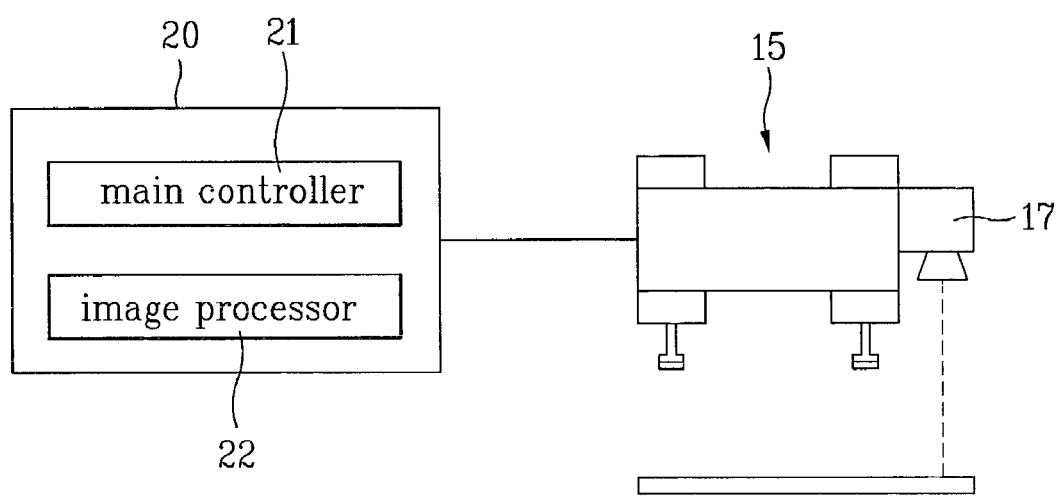
FIG. 2 is a view of a construction, of a semiconductor test handler which performs processes of recognizing a working position in the device transfer apparatus in accordance with the present invention.

FIG. 2 is a construction of the handler applicable to the method for recognizing the working position in the device transfer apparatus in accordance with the present invention. Referring to FIG. 2, a CCD camera 17 is installed in one side of device transfer units 15, which is the device transfer apparatus, so as to obtain image information of respective trays and change kits. The CCD camera 17 is connected to an image processor 22 of a control unit 20 for controlling an entire operation of the handler.

The image processor 22 processes the image information received from the CCD camera 17 and transfers the processed image information to a main controller 21 of the control unit 20. The main controller 21 calculates the working positions of the respective device transfer units 15 according to the information transferred from the image processor 22.

Figure 3:
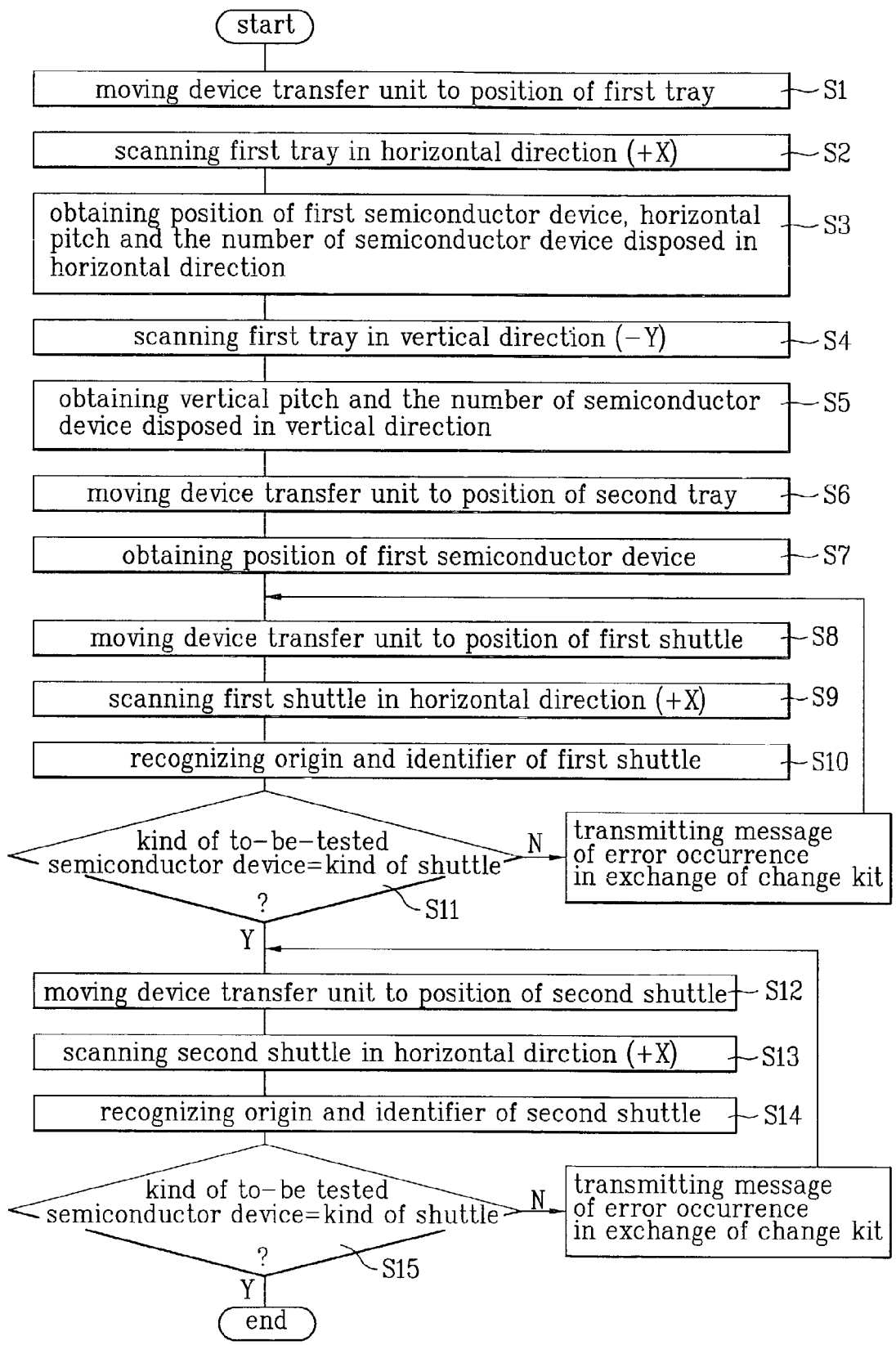
FIG. 3 is a flowchart of an example of a method for recognizing a working position in the device transfer apparatus in accordance with the present invention.
Figure 4:
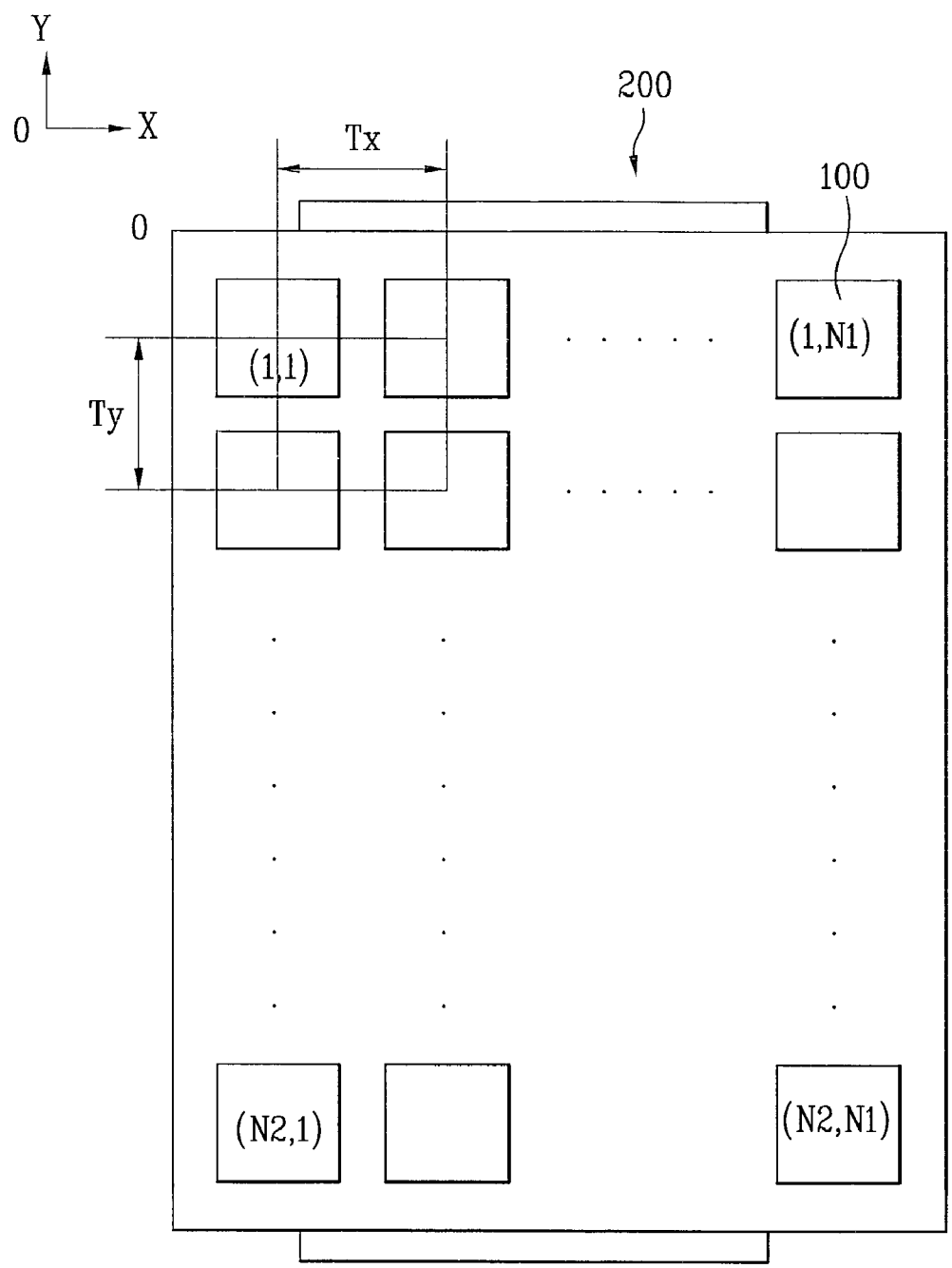
FIG. 4 is an exemplary plan view of a tray when the method for recognizing the working position of the tray is performed in accordance with the present invention.
Figure 5:
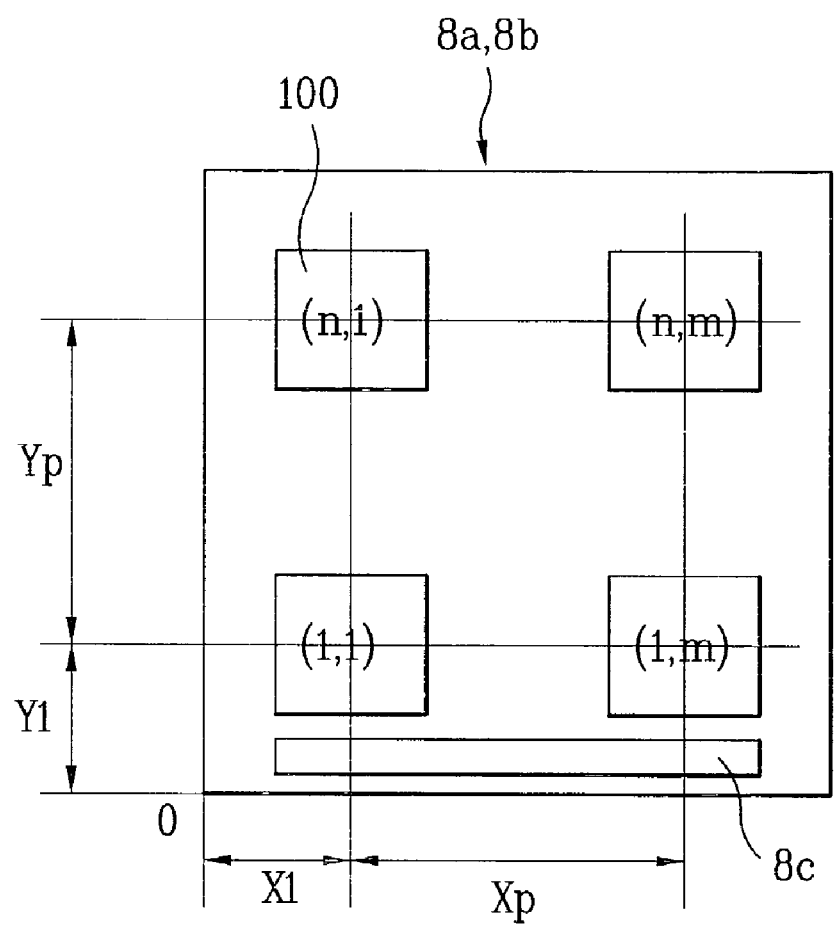
FIG. 5 is an exemplary plan view of a shuttle when the method for recognizing the working position of the shuttle is performed in accordance with the present invention.

FIG. 3 is a flowchart explaining a method for recognizing the working positions of the device transfer units 15. FIGS. 4 and 5 are exemplary views showing the method for recognizing the tray 200 and shuttles 8a and 8b corresponding to the change kits. Hereinafter, the method for recognizing the working position using the CCD camera 17 will be described in detail.

Referring to FIG. 3, the device transfer unit 15 is moved to a first tray 200 disposed at the loading unit 2 (see FIG. 1) (S1). Then, the CCD camera 17 scans the first tray 200 while the device transfer unit 15 is moved in a horizontal direction (+X) (S2). Information on position (1, 1) of the semiconductor device located in the first column and first row of the first tray 200, horizontal pitch Tx of the row, and the number of the semiconductor devices disposed in the horizontal direction are obtained (S3).

Then, information on vertical pitch Ty of the semiconductor devices 100 disposed on the first tray 200 and the number of the semiconductor devices 100 disposed in the vertical direction are obtained while the device transfer unit 15 is moved in a vertical direction (−Y) (S4 and S5).

Next, the device transfer unit 15 is moved to a position of a second tray 200 (S6). The CCD camera 17 obtains an image while the device transfer unit 15 is moved at an upper portion of the second tray 200, thereby obtaining information on the position (1, 1) of the semiconductor device disposed at the first column and first row (S7).

Since the second tray 200 is the same kind as the first tray 200, it is sufficient if only the information of the position (1, 1) of the first semiconductor device loaded on the second tray is obtained.

If the information of both the first and second trays 200 are obtained, the CCD camera 17 scans the images while the device transfer unit 15 is moved to the first shuttle 8a and in the horizontal direction (+X) (S8 and S9). Then, information on a position of an origin (0) based on a vertex of the first shuttle 8a and a shuttle identifier (8c) formed on an upper face of the first shuttle 8a are obtained (S10).

The shuttle identifier 8c includes a code representing that the kind of the change kit is the shuttle, a code representing the kind of the to-be-loaded semiconductor device and/or information on basic size of the shuttle.

Then, the image information of the shuttle processed at the image processor 22 is compared with the shuttle information inputted in a database of the main controller 21, so that it is determined whether or not the kind of the shuttle is in accord with that of the to-be-tested semiconductor device (S11). If the kind of the shuttle is not in accord therewith, the control unit 20 transmits a message representing there occurs an error in an exchange of the change kit and instructs the user to exchange the change kit.

If the kind of the shuttle is in accord with that of the to-be-tested semiconductor device, the pick-up device 15 is moved to the second shuttle 8b. Then, information on position of an origin (0) of the second shuttle and the shuttle identifier 8c are obtained (S12, S13 and S14) and it is determined whether or not the exchange of the shuttle is correctly achieved comparing the obtained information with the shuttle information inputted in the database (S15). TF it is correctly achieved, the device transfer unit completes the recognizing operation of the working position.

The main controller 21 of the control unit 20 calculates a working start position, a pick-up position and a working complete position using the image information of the trays 200 and the shuttles 8a and 8b, which are transferred from the image processor 22, so that the device transfer unit 15 is transferred to a correct working position in the operation of the handler.

Meanwhile, although the above method for recognizing the working position describes that the device transfer unit teaches the working positions of two trays and two shuttles, it is identically and similarly applicable to the recognizing of the working positions of the change kits, such as two or more shuttles, test sockets or soaking plates.

As described above, in accordance with the present invention, it is unnecessary to set a reference point on the handler body in case of recognizing and setting the working position of the device transfer apparatus. Further, required information of the trays and the change kits can be correctly and rapidly obtained automatically through a simple working procedure, thereby reducing a working delay time and improving a working efficiency.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for determining working positions for a device transfer apparatus in a semiconductor test handler, wherein an image input unit is mounted on the device transfer apparatus, the method comprising:
   moving the device transfer apparatus in horizontal and vertical directions over a first tray configured to hold a plurality of semiconductors and capturing images of the first tray with the image input unit;
   determining a configuration of the first tray by analyzing the images captured by the image input unit;
   moving the device transfer apparatus over a second tray and capturing an image of a first semiconductor holding position on the second tray; and
   determining working positions for the device transfer apparatus based on a position of a vertex of the first tray relative to a position of at least one semiconductor holding position on the first tray, and using the images of the first tray and the image of the first semiconductor holding position on the second tray to determine working positions for the device transfer apparatus for both the first and second trays.

2. The method of claim 1, wherein the step of determining a configuration of the first tray comprises determining a number of columns and a number of rows of semiconductor holding positions on the first tray.

3. The method of claim 2, wherein the step of determining a configuration of the first tray further comprises determining one of a size of semiconductors held in the first tray and a size of the semiconductor holding positions on the first tray.

4. The method of claim 1, wherein the step of determining a configuration of the first tray further comprises determining one of a size of semiconductors held in the first tray and a size of the semiconductor holding positions on the first tray.

5. The method of claim 1, wherein the step of determining a configuration of the first tray comprises determining a number of columns and a number of rows of semiconductor holding positions on the first tray.

6. The method of claim 1, wherein the step of determining a configuration of the first tray comprises determining a horizontal pitch between columns of semiconductor device holding positions on the first tray, and determining a vertical pitch between rows of semiconductor device holding positions on the first tray.

7. The method of claim 1, further comprising comparing the determined configuration of the first tray to information about the type semiconductors to be tested in the test handler and determining if the configuration of the first tray is compatible with the type of semiconductors to be tested.

8. The method of claim 1, wherein the test handler includes a shuttle that moves semiconductors from an interim position to a position adjacent a test socket, and wherein the method includes reading a code from the shuttle with the image input unit.

9. The method of claim 8, further comprising determining a configuration of the shuttle based on the code read from the shuttle.

10. The method of claim 9, further comprising comparing the determined configuration of the shuttle with the determined configuration of the first tray to determine if the shuttle and the first tray are compatible.

11. The method of claim 9, further comprising comparing the determined configuration of the shuttle to information about the type semiconductors to be tested in the test handler and determining if the configuration of the shuttle is compatible with the type of semiconductors to be tested.

12. The method of claim 1, wherein the test handler includes a shuttle that moves semiconductors from an interim position to a position adjacent a test socket, and wherein the method further comprises:

moving the device transfer apparatus over the shuttle to capture images of the shuttle with the image input unit; and determining a configuration of the shuttle based on the images of the shuttle captured by the image input unit.

13. The method of claim 12, wherein the step of determining a configuration of the shuttle comprises determining a location of a first semiconductor device holding position on the shuttle, determining a horizontal pitch between columns of semiconductor device holding positions on the shuttle, and determining a vertical pitch between rows of semiconductor device holding positions on the shuttle.

14. The method of claim 13, wherein the step of determining working positions comprises using the images of the shuttle to determine working positions for the device transfer apparatus for the shuttle.

15. The method of claim 12, wherein the step of determining working positions comprises using the images of the shuttle to determine working positions for the device transfer apparatus for the shuttle.

16. A method for determining working positions for a device transfer apparatus in a semiconductor test handler, wherein an image input unit is mounted on the device transfer apparatus, and wherein the test handler includes a shuttle that moves semiconductors from an interim position to a position adjacent a test socket, the method comprising:

moving the device transfer apparatus in horizontal and vertical directions over a first tray configured to hold a plurality of semiconductors and capturing images of the first tray with the image input unit;

moving the device transfer apparatus over a second tray to capture an image of the second tray with the image input unit;

moving the device transfer apparatus over the shuttle to capture images of the shuttle with the image input unit;

determining a configuration of the first and second trays and the shuttle by analyzing the images captured by the image input unit; and determining working positions for the device transfer apparatus based on a horizontal and vertical pitch of a plurality of semiconductor holding positions on the first tray and a position of a first semiconductor holding position on the second tray.

17. The method of claim 16, wherein the step of determining a configuration of the first tray comprises determining a location of a first semiconductor device holding position on the first tray, determining a horizontal pitch between columns of semiconductor device holding positions on the first tray, and determining a vertical pitch between rows of semiconductor device holding positions on the first tray.

18. The method of claim 17, wherein the step of moving the device transfer apparatus over the second tray allows the image input unit to capture an image of a location of a first semiconductor device holding position on the second tray.

19. The method of claim 16, wherein the step of determining a configuration of the shuttle comprises interpreting a code read from the shuttle using the image input unit.

20. The method of claim 16, wherein the step of determining a configuration of the shuttle comprises determining a location of a first semiconductor device holding position on the shuttle, determining a horizontal pitch between columns of semiconductor device holding positions on the shuttle, and determining a vertical pitch between rows of semiconductor device holding positions on the shuttle.

* * * * *